US007060409B2

(12) United States Patent
Tao et al.

(10) Patent No.: US 7,060,409 B2
(45) Date of Patent: Jun. 13, 2006

(54) IMAGEABLE ELEMENTS WITH IMPROVED DOT STABILITY

(75) Inventors: Ting Tao, Fort Collins, CO (US); Jeffrey James Collins, Greeley, CO (US); Thomas Jordan, Windsor, CO (US); Scott A. Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 272 days.

(21) Appl. No.: 10/384,988

(22) Filed: Mar. 10, 2003

(65) Prior Publication Data

US 2004/0180283 A1 Sep. 16, 2004

(51) Int. Cl.
*G03F 7/021* (2006.01)
*G03F 7/30* (2006.01)

(52) U.S. Cl. ...................... 430/163; 430/157; 430/176; 430/270.1; 430/302

(58) Field of Classification Search ................ 430/157, 430/164, 176, 302, 163, 270.1
See application file for complete search history.

(56) References Cited

U.S. PATENT DOCUMENTS 4,708,925 A 11/1987 Newman
5,340,699 A 8/1994 Haley et al.
5,372,907 A 12/1994 Haley et al.
5,700,619 A 12/1997 Baumann et al.
5,763,134 A * 6/1998 Busman et al. ............. 430/157
5,919,601 A * 7/1999 Nguyen et al. .......... 430/278.1
5,965,319 A * 10/1999 Kobayashi .................. 430/176
6,358,669 B1 3/2002 Savariar-Hauck et al.
6,391,519 B1 5/2002 Kunita
2001/0026900 A1* 10/2001 Shimada et al. ............ 430/138
2003/0113655 A1* 6/2003 Hayakawa et al. ......... 430/176

FOREIGN PATENT DOCUMENTS

EP 1 182 033 A1 2/2002
EP 1 186 407 A1 3/2002
EP 1 241 002 A2 9/2002

OTHER PUBLICATIONS

Fryer et al, Study of Acid Diffusion in Resist Near the Glass Transition Temperature, Journal, 1999, pp. 3351-3355, vol. 17(6).
Arai et al, A Sensitive Positive Resist for 0.1-µm Electron-Beam Direct-Writing Lithography , Journal, 1997, pp. 625-628, vol. 10(4).
Thackeray et al, Following the Acid: Effect of Acid Surface Depletion on Phenolic Polymers, Journal, 1995, pp. 110-123, vol. 614.
Sakamizu et al, Proceedings of SPIE- The International Society for Optical Engineering, Journal, 1997, p. 448-458, (Abstract).

* cited by examiner

*Primary Examiner*—John S. Chu

(57) ABSTRACT

Imageable elements with improved dot stability are disclosed. The imageable elements comprise a layer of an imageable composition over a support. The imageable composition comprises an infrared absorbing compound, an acid generator, an acid activatable crosslinking agent, a polymeric binder, and about 0.01 wt % to 1 wt % of an added onium compound. The elements may be thermally imaged and developed to produce images useful as lithographic printing plates.

24 Claims, 1 Drawing Sheet

IMAGEABLE ELEMENTS WITH IMPROVED DOT STABILITY

FIELD OF THE INVENTION

The invention relates to lithographic printing. In particular, this invention relates to imageable elements useful as lithographic printing plate precursors with improved dot stability.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. If, after imaging, the imaged regions of the imageable layer are removed in the developing process revealing the underlying hydrophilic surface of the substrate, the precursor is positive-working. Conversely, if the unimaged regions are removed by the developing process, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask, which has clear and opaque regions. Imaging takes place in the regions under the clear regions of the mask but does not occur in the regions under the opaque regions of the mask. The mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of imageable elements, which obviates the need for imaging through a negative, is becoming increasingly important in the printing industry. Negative-working imageable elements that comprise compounds that form an acid on thermal imaging have been developed for use with infrared lasers. However, dot gain and dot stability is a problem in these systems. Dot gain occurs when the size of a printed dot is larger than the specified size. Dot stability measures the variation in dot size with variation in exposure. Thus, a need exists for negative-working imageable elements that can be imaged without exposure through a negative but do not have these disadvantages.

SUMMARY OF THE INVENTION

In one aspect, the invention is an imageable element comprising a layer of an imageable composition over a support. The imageable composition comprises an infrared absorbing compound, an acid generator, an acid activatable crosslinking agent, a polymeric binder, and about 0.01 wt % to 1 wt % of an added onium compound. In another aspect, the invention is a method for forming an image by imaging and developing the imageable element. Typically, these imageable elements are heated at about 110° C. to 150° C. after imaging but before developing.

DETAILED DESCRIPTION OF THE INVENTION

Figure 1:
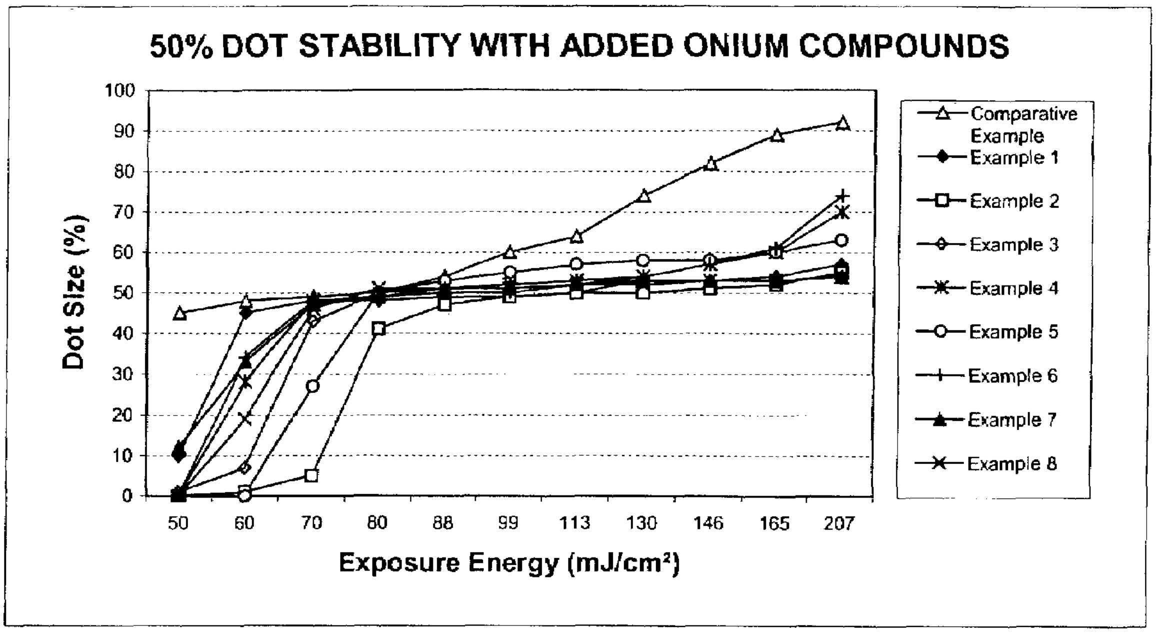
FIG. 1 shows the variation of the 50% dot in the absence of and in the presence of an added onium compound.

Unless the context indicates otherwise, in the specification and claims, the terms binder, infrared absorbing compound, acid generator, acid activatable crosslinking agent, added onium compound, coating solvent, and similar terms also include mixtures of such materials. Unless otherwise specified, all percentages are percentages by weight. Thermal imaging refers to imaging with a hot body, such as a thermal head, or with infrared radiation.

Imageable Element

The imageable element comprises an imageable layer, which comprises an imageable composition, over the surface of a substrate. Other layers that are conventional components of imageable elements may also be present. For example, the imageable layer may be on the substrate, or other layers may be present between the imageable layer and the substrate.

Imageable Composition

The imageable composition is a negative working imageable composition that comprises an acid generator, an acid activatable crosslinking agent; a polymeric binder, a photothermal conversion material, and an added onium compound. Other ingredients that are conventional ingredients of negative working imageable compositions may also be present. Negative working imageable compositions that comprise an acid generator, an acid activatable crosslinking agent, a polymeric binder, and a photothermal conversion material, are disclosed, for example, in Haley, U.S. Pat. No. 5,372,907; Nguyen, U.S. Pat. No. 5,919,601; Kobayashi, U.S. Pat. No. 5,965,319; Busman, U.S. Pat. No. 5,763,134, and WO 00/17711, the disclosures of which are all incorporated herein by reference.

Acid Generators

Acid generators are precursors that form a Brönsted acid by thermally initiated decomposition. Non-ionic acid generators include, for example, haloalkyl-substituted s-triazines, which are described, for example, in Smith, U.S. Pat. No. 3,779,778. Haloalkyl-substituted s-triazines are s-triazines substituted with one to three $CX_3$ groups in which is X is bromo or, preferably, chloro. Examples include 2-phenyl-4,6-bis(trichloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, and 2-[4-(2-ethoxyethyl)-naphtho-1-yl]-4,6-bis-trichloromethyl-s-triazine.

Ionic acid generators include, for example, onium salts in which the onium cation is iodonium, sulphonium, phosphonium, oxysulphoxonium, oxysulphonium, sulphoxonium, ammonium, diazonium, selenonium, or arsonium, and the anion is a chloride, bromide, or a non-nucleophilic anion such as tetra-fluoroborate, hexafluorophosphate, hexafluoroarsenate, hexafluoroantimonate, triflate, tetrakis(pentafluoro-phenyl)borate, pentafluoroethyl sulfonate, p-methyl-benzyl sulfonate, ethyl sulfonate, trifluoromethyl acetate, and pentafluoroethyl acetate. Typical onium salts include, for example, diphenyl iodonium chloride, diphenyl iodonium hexafluorophosphate, diphenyl iodonium hexafluoroantimonate, 4,4'-dicumyl iodonium chloride, 4,4'-dicumyl iodonium hexafluorophosphate, N-methoxy-α-picolinium-p-toluene sulfonate, 4-methoxybenzene-diazonium tetrafluoroborate, 4,4'-bis-dodecylphenyl iodonium-hexafluorophosphate, 2-cyanoethyl-triphenylphosphonium chloride, bis-[4-diphenylsulfoniophenyl]sulfide-bis-hexafluorophosphate, bis-4-dodecylphenyliodonium hexafluoroantimonate, triphenyl sulfonium hexafluoroantimonate, triphenyl sulfonium tetrafluoroborate, 2-methoxy-4-aminophenyl diazonium hexafluorophosphate, phenoxyphenyl diazonium hexafluoroantimonate, and anilinophenyl diazonium hexafluoroantimonate.

Particularly useful ionic acid generators include iodonium, sulfonium, and diazonium salts in which the anion is an organic sulfate or thiosulfate, such as, for example, methyl sulfate or thiosulfate, ethyl sulfate or thiosulfate, hexyl sulfate or thiosulfate, octyl sulfate or thiosulfate, decyl sulfate or thiosulfate, dodecyl sulfate and thiosulfate, trifluoromethyl sulfate or thiosulfate, benzyl sulfate or thiosulfate, pentafluorophenyl sulfate and thiosulfate. Typical acid generators include, for example, diphenyl iodonium octyl sulfate, diphenyl iodonium octyl thiosulfate, triphenyl sulfonium octyl sulfate, 4,4'-dicumyl iodonium p-tolyl sulfate, 2-methoxy-4-(phenylamino)-benzenediazonium octyl sulfate, 2-methoxy-4-(phenylamino)-benzenediazonium hexadecyl sulfate, 2-methoxy-4-(phenylamino)-benzenediazonium dodecyl sulfate, and 2-methoxy-4-(phenylamino)-benzenediazonium vinyl benzyl thiosulfate. These acid generators can be prepared by mixing an onium salt, such as an onium chloride, bromide, or bisulfate, containing the desired cation with a sodium or potassium salt containing the desired anion, i.e., the desired alkyl or aryl sulfate or thiosulfate, either in water or in an aqueous solvent including a hydrophilic solvent such as an alcohol, for example methanol, ethanol, or propylene glycol methyl ether.

Acid Activatable Crosslinking Agents and Polymeric Binders

Acid activatable crosslinking agents may comprise at least two acid activatable reactive groups, such as the hydroxymethyl group, the alkoxymethyl group, the epoxy group, and the vinyl ether group, bonded to an aromatic ring. Examples include methylol melamine resins, resole resins, epoxidized novolac resins, and urea resins. Other examples are amino resins having at least two alkoxymethyl groups (e.g. alkoxymethylated melamine resins, alkoxymethylated glycolurils and alkoxymethylated benzoguanamines). Phenol derivatives comprising at least two groups such as the hydroxymethyl group and/or the alkoxymethyl group provide good fastness in an image portion when an image is formed. Examples of phenol derivatives include resole resins.

Resole resins are obtained by reaction of phenolic compounds with aldehydes, but under different reaction conditions than those that produce novolac resins. A typical example of a resole resin useful with novolac resins is the resole resin prepared from bis-phenol A and formaldehyde. Resole resins include, for example, GP649D99 resole (Georgia Pacific) and BKS-5928 resole resin (Union Carbide).

Phenol derivatives having a hydroxymethyl group can be prepared by reaction of a phenol without a hydroxymethyl group and formaldehyde in the presence of a base catalyst. Preferably the reaction temperature is 60° C. or less to prevent resinification or gelation of the phenol derivative. Phenol derivatives having an alkoxymethyl group can be prepared by acid catalyzed reaction of the phenol derivative having a hydroxymethyl group with an alcohol. Preferably, the reaction temperature is 100° C. or less to prevent resinification or gelation of the phenol derivative. These phenol derivatives can be synthesized by the method disclosed in EP 632,003 A1. These phenol derivatives, especially phenol derivatives having an alkoxymethyl group, have superior storage properties.

The acid activatable crosslinking agent used in the composition may depend on the polymeric binder. Any combination of acid activatable crosslinking agent and polymeric binder that can react to form a crosslinked binder under the imaging and/or processing conditions may be used. Various combinations of polymeric binder and acid activatable crosslinking agent are known in the art. In general, the binder is a polymer, or mixture of polymers, capable of undergoing an acid-catalyzed condensation reaction with the crosslinking agent when the element is heated to about 60–220° C.

Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. A useful novolac resin for use in this invention is the resin prepared from m-cresol and formaldehyde.

Acrylic polymers having an alkaline-soluble group include those that contain a monomer that has an acidic group such as carboxyl group or a hydroxyphenyl group. Examples of acrylic copolymers having an alkaline-soluble group include methacrylic acid-allylmethacrylate copolymers, methacrylic acid-benzylmethacrylate copolymers, methacrylic acid-hydroxyethylmethacrylate copolymers, poly(hydroxyphenyl methacrylamide), poly(hydroxyphenylcarbonyl-oxyethyl acrylate), and poly(2,4-dihydroxyphenyl carbonyloxyethyl acrylate). Polymers whose component units include 1 mol % or more of (meth)acrylic acid, hydroxystyrene, and/or hydroxyphenyl (meth)acrylamide based on the total component units and whose weight-average molecular weight is 2,000 to 500,000, preferably 4,000 to 300,000 are preferred. Preferred urethane polymers have 1 mol % or more of a monomer having an acidic group, such as carboxylic acid or a hydroxyphenyl group, such as polymers prepared by reaction of diphenylmethane diisocyanate, hexamethylene diisocyanate, and/or tetraethylene glycol, with 2,2-bis(hydroxymethyl) propionic acid.

Haley, U.S. Pat. No. 5,372,907, discloses a radiation-sensitive composition that is sensitive to both ultraviolet/visible and infrared radiation. The composition comprises a resole resin and a novolac resin. In these compositions, the novolac resin is the polymeric binder and the resole resin is the acid activatable crosslinking agent. Nguyen, U.S. Pat. No. 5,919,601, discloses radiation-sensitive compositions imageable by infrared and ultraviolet/visible radiation. These compositions comprise (1) a polymeric binder containing reactive pendant groups selected from hydroxy, carboxylic acid, sulfonamide, and alkoxymethylamides; and (2) a resole resin, a $C_1$–$C_5$ alkoxymethyl melamine or glycoluril resin, a poly($C_1$–$C_5$-alkoxy-methylstyrene), a poly($C_1$–$C_5$-alkoxymethylacrylamide), a derivative thereof, or a combination thereof. Preferably, the crosslinking resin is a resole resin prepared from a $C_1$–$C_5$ alkylphenol and formaldehyde; a tetra $C_1$–$C_5$-alkoxymethyl glycoluril; a polymer of (4-methoxymethylstyrene); a polymer of (N-methoxymethyl) acrylamide; a polymer of (N-i-butoxymethyl)acrylamide; or a butylated phenolic resin. Kobayashi, U.S. Pat. No. 5,965,319, discloses a negative working recording material comprising an acid activatable crosslinking agent, preferably having at least two hydroxymethyl or alkoxymethyl groups bonded to a benzene ring and a polymer compound having an alkaline-soluble group such as a novolac resin. Typical crosslinking agents are phenols containing hydroxymethyl groups, prepared by condensation of phenols with formaldehyde. Busman, U.S. Pat. No. 5,763,134, discloses activatable crosslinking agents, such as 1,3,5-trihydroxymethylbenzene, 1,3,5-triacetoxymethylbenzene, and 1,2,4,5-tetraacetoxymethylbenzene. Other polymeric binders and acid activatable crosslinking agents will be apparent to those skilled in the art.

Photothermal Conversion Material

The imageable composition comprises an absorber, known as a photothermal conversion material. Photothermal conversion materials absorb radiation and convert it to heat. To prevent sludging of the developer by insoluble material, dyes that are soluble in the developer are preferred.

The photothermal conversion material may be, for example, an indoaniline dye, an oxonol dye, a porphyrin derivative, an anthraquinone dye, a merostyryl dye, a pyrylium compound, or a squarylium derivative with the appropriate absorption spectrum and solubility. Dyes, especially dyes with a high extinction coefficient in the range of 750 nm to 1200 nm, are preferred. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful cyanine dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclopenten-1-yl]-etheny]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), and IR Dye A.

IR Dye A

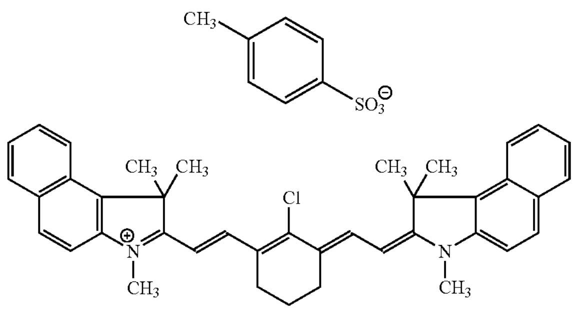

The amount of infrared absorbing compound in the imageable composition is generally sufficient to provide an optical density of at least 0.05, and preferably, an optical density of from about 0.5 to about 2 at the imaging wavelength. As is well known to those skilled in the art, the amount of compound required to produce a particular optical density can be determined from the thickness of the underlayer and the extinction coefficient of the infrared absorbing compound at the wavelength used for imaging using Beers law. The imageable composition typically comprises about 0.1 to 20% by weight, more preferably about 0.5 to 10% by weight, of the infrared absorbing compound based on the total weight of the composition.

Added Onium Compound

The dot stability can be improved by the presence of about 0.01 wt % to 1.0 wt %, preferably 0.02 wt % to 0.5 wt %, more preferably 0.025 wt % to 0.5 wt %, even more preferably about 0.03 wt % to about 0.45 wt %, based on the total weight of the imageable composition, of an added onium compound. If the acid generator is an onium compound, the added onium compound is different from the acid generator.

Cations for the added onium compound include quaternary ammonium, iodonium, sulphonium, phosphonium, oxysulphoxonium, oxysulphonium, sulphoxonium, ammonium, diazonium, selenonium and arsonium. Preferred cations include quaternary ammonium, phosphonium, iodonium, sulfonium or sulphoxonium. The anion for the added onium compound is typically is fluoride, chloride, bromide, iodide, or a non-nucleophilic anion such as is described above. Chloride, bromide, and iodide are preferred anions.

Other Ingredients

The imageable composition may also comprise other ingredients such as dyes and surfactants that are conventional ingredients of imageable compositions. Surfactants may be present in the imageable composition as, for example, coating aids. A dye may be present to aid in the visual inspection of the imaged and/or developed element. Printout dyes distinguish the imaged regions from the unimaged regions during processing. Contrast dyes distinguish the unimaged regions from the imaged regions in the developed imageable element. Preferably the dye does not absorb the imaging radiation. Triarylmethane dyes, such as ethyl violet, crystal violet, malachite green, brilliant green, Victoria blue B, Victoria blue R, Victoria pure blue BO, and D11 (PCAS, Longjumeau, France) may act as the contrast dye.

Composition

The imageable composition typically comprises about 0.1 to 20% by weight, more preferably about 0.5 to 10% by weight of the infrared absorbing compound based on the total weight of the composition. The imageable composition typically comprises about 1 to 50% by weight, preferably about 1.5 to 25% by weight, and more preferably about 2 to 20% by weight of the acid generator, based on the total weight of the composition. The imageable composition typically comprises about 5 to 70% by weight, and preferably about 10 to 65% by weight of the cross linking agent based on the total weight of the composition. The imageable composition typically comprises about 10 to 90% by weight, preferably about 20 to 85% by weight, and more preferably about 30 to 80% by weight of the polymer based on the total weight of the composition. The imageable composition typically comprises about 0.01 to 1 wt %, preferably 0.02 to 0.75 wt %, more preferably 0.025 to 0.5 wt %, even more preferably about 0.03 wt % to about 0.45 wt %, of the added onium compound.

Substrate

The imageable composition may be coated over a variety of substrates. The particular substrate will generally be determined by the intended application. For lithographic printing, the substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 μm to about 600 μm. Typically, the substrate comprises an interlayer between the aluminum support and the layer of imageable composition. The interlayer may be formed by treatment of the support with, for example, silicate, dextrine, hexafluorosilicic acid, phosphate/fluoride, polyvinyl phosphonic acid (PVPA) or vinyl phosphonic acid copolymers.

The back side of the substrate (i.e., the side opposite the underlayer and layer of imageable composition) may be coated with an antistatic agent and/or a slipping layer or matte layer to improve handling and "feel" of the imageable element. Typically, the imageable layer has a coating weight of about 0.5 to about 4 g/m$^2$, preferably 0.8 to 3 g/m$^2$.

Preparation of the Imageable Element

The imageable element may be prepared by applying the layer of imageable composition over the hydrophilic surface of the substrate. The layer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The term "coating solvent" include mixtures of solvents and is used although some or all of the materials may be suspended or dispersed in the coating solvent rather than in solution. Selection of coating solvents depends on the nature of the components present in the various layers. Alternatively, the imageable layer may be applied by conventional extrusion coating methods from a melt mixture of layer components. Typically, such a melt mixture contains no volatile organic solvents.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 700 nm to about 1200 nm, is typically used for imaging. Imaging is conveniently carried out with a laser emitting at about 830 nm, about 1056 nm, or about 1064 nm. Suitable commercially available imaging devices include image setters such as the Creo Trendsetter (CREO, British Columbia, Canada) and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers or the GS618-400 thermal plotter (Oyo Instruments, Houston, Tex., USA).

After the imaging, the imaged imageable element may be heated. This optional heating step can be carried out by radiation, convection, contact with heated surfaces, for example, with rollers, or by immersion in a heated bath comprising an inert liquid, for example, water. Preferably, the imaged imageable element is heated in an oven.

The heating temperature is typically determined by the fog point of the imageable element. The fog point is defined as the lowest temperature, at a heating time of two minutes, required to render a thermally imageable element non-processable. When the imaged imageable element is heated above the fog point, the unimaged regions crosslink. Because they are not removed by developer, no image is formed.

Preferably, the temperature is about 28° C. or less below the fog point at a heating time of two minutes, more preferably about 17° C. or less below the fog point at a heating time of two minutes and most preferably about 8° C. below the fog point. Typically the heating temperature is about 110° C. to 150° C. The heating time can vary widely, depending on the method chosen for the application of heat as well as the other steps in the process. If a heat-transferring medium is used, the heating time will preferably be from about 30 seconds to about 30 minutes, more preferably from about 1 minute to about 5 minutes. When the imaged imageable element is heated in an oven, the heating time is preferably from about 1 minute to about 5 minutes.

Imaging produces an imaged element, which comprises a latent image of imaged (exposed) regions and complementary unimaged (unexposed) regions. Development of the imaged element to form a printing plate, or printing form, converts the latent image to an image by removing the unimaged regions, revealing the hydrophilic surface of the underlying substrate.

The developer may be any liquid or solution that can remove the unimaged regions of the layer of imageable composition, without substantially affecting the complementary imaged regions. Suitable developers depend on the solubility characteristics of the ingredients present in the imageable element.

A conventional aqueous alkaline solution can be used as a developer or a replenisher. Useful developers are aqueous solutions having a pH of about 7 or above. Preferred aqueous alkaline developers are those that have a pH between 8 and about 13.5, typically at least about 11, preferably at least about 12. These developers typically comprise at least one alkali metal silicate, such as lithium silicate, sodium silicate, and/or potassium silicate having a $SiO_2$ to $M_2O$ weight ratio of at least about 0.3, in which M is the alkali metal. The amount of the silicate in the developer is typically at least 20 g of $SiO_2$ per 1000 g of developer.

In addition to the alkali metal silicate, alkalinity can be provided by a suitable concentration of any suitable base, such as, for example, ammonium hydroxide, sodium hydroxide, lithium hydroxide, and/or potassium hydroxide. A developer may also comprise a buffer system to keep the pH relatively constant. Typically buffer systems include, for example: combinations of water-soluble amines, such as ethanol amine, diethanol amine, tri-ethanol amine, or tri-iso-propyl amine, with a sulfonic acid, such as benzene sulfonic acid or 4-toluene sulfonic acid; mixtures of ethylenediamine tetracetic acid (EDTA) and the tetra sodium salt of EDTA, mixtures of phosphate salts, such as mixtures of mono-alkali phosphate salts with tri-alkali phosphate salts; and mixtures of alkali borates and boric acid. Optional components are anionic, nonionic and amphoteric surfactants (up to 3% on the total composition weight), biocides (antimicrobial and/or antifungal agents), antifoaming agents or chelating agents (such as alkali gluconates), and thickening agents (water soluble or water dispersible polyhydroxy compounds such as glycerin or polyethylene glycol). However, high pH buffers typically do not contain organic solvents. Water typically comprises the balance of the developer. Typical commercially available high pH developers include: ProTherm™ Developer, Greenstar™ Developer, Goldstar™ Developer, 4030 Developer, PD-1 Developer, and MX 1710 Developer, all available from Kodak Polychrome Graphics, Norwalk, Conn.

Development is carried out for a long enough time to remove the unimaged regions of the layer of imageable composition, but not long enough to remove the imaged regions. The developer is typically applied by spraying the imaged element with sufficient force to remove the unimaged regions. Alternatively, development may be carried out in a processor or the imaged element may be brushed with the developer. In each instance, a printing plate is produced. Development may conveniently be carried out in a commercially available spray-on processor, such the 85 NS (Kodak Polychrome Graphics) or the Unigraph Quartz K85 processor (Glunz & Jensen, Elkwood, Va., USA).

Following development, the printing plate is rinsed with water and dried. Drying may be conveniently carried out by infrared radiators or with hot air.

Optionally, the resulting printing plate may be baked to increase the run length of the plate. Baking can be carried out, for example at about 220° C. to about 240° C. for about 7 to 10 minutes, or at a temperature of 120° C. for 30 min. Although post-development baking is typically not necessary, it may be preferred for some applications.

INDUSTRIAL APPLICABILITY

The imageable elements of the invention are useful as lithographic printing plate precursors. They have improved dot stability.

Once the imageable element has been imaged and processed to form a printing plate, printing can be carried out by applying a fountain solution and then a lithographic ink to the image on its surface. Fountain solution is taken up by the surface of the substrate exposed by imaging and development, and the ink is taken up by the image formed by the imageable layer. The ink is transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, “coating solution” refers to the mixture of solvent or solvents and additives coated, even though some of the additives may be in suspension rather than in solution, and “total solids” refers to the total amount of nonvolatile material in the coating solution even though some of the additives may be nonvolatile liquids at ambient temperature. Except where indicated, the indicated percentages are percentages by weight based on the total solids in the coating solution.

| Glossary | |
|---|---|
| BYK 307 | Polyethoxylated dimethylpolysiloxane copolymer (Byk Chemie, Wallingford, CT, USA) |
| D11 | Ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1); colorant dye (PCAS, Longjumeau, France) |
| DOWANOL ® PM | Propylene glycol methyl ether (1-methoxy-2-propanol) (Dow, Midland, MI, USA) |
| IR Dye A | Infrared absorbing dye ($lambda_{max}$ = 830 nm) (Eastman Kodak, Rochester, NY, USA) (see structure above) |
| MSHDS | 2-Methoxy-4-(phenylamino)-benzenediazonium hexadecyl sulfate |
| N-13 | Novolac resin; 100% m-cresol; MW 13,000 (Eastman Kodak Rochester, NY, USA) |
| ProTherm ™ Developer | Aqueous alkaline positive developer (Kodak Polychrome Graphics, Norwalk, CT, USA) |

D11

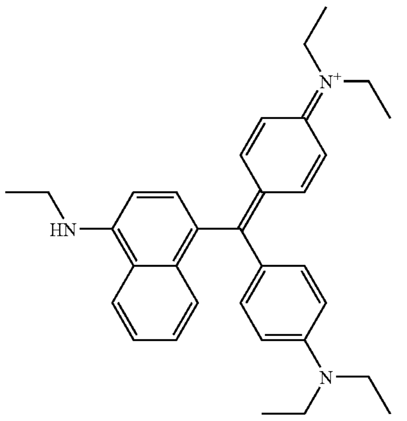

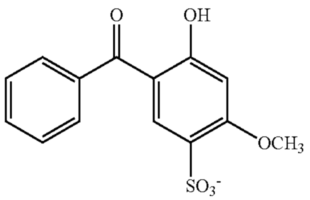

Comparative Example

The following coating solution was prepared. 7.2 g of a DOWANOL® PM solution containing 25% of resole resin, 8.8 g of an acetone solution containing 35% N-13, 0.75 g of MSHDS, 0.47 g of IR Dye A, 0.07 g of D11, and 0.2 g of a 10% solution of BYK 307 in 1-methoxy-2-propanol were combined in 80 g of 1-methoxy-2-propanol. The coating solution was coated onto an electrochemically grained and anodized aluminum substrate post-treated with polyvinylphosphonic acid and the resulting element dried with hot air at 88° C. for about 2 minutes on a rotating drum. The dry coating weight was about 1.4 g/m$^2$.

The resulting imageable element was imaged on a CREO Trendsetter 3244ximage setter (CreoScitex, Burnaby, British Columbia, Canada) at 830 nm at a laser power of 5.5 W and a series of drum speeds from 250 to 60 rpm (exposure energy 50 to 210 mJ/cm$^2$) and then preheated at 131° C. for about 2 min in a Heavy Duty Oven (Wisconsin Oven, East Troy, Wis., USA) and developed in an Unigraph Quartz K85 processor (Glunz & Jensen, Elkwood, Va., USA) charged with ProTherm™ developer at 25° C. The minimum exposure energy to achieve maximum processed density was about 70 mJ/cm$^2$. The stability of the 50% dot screens over the exposure range is shown in FIG. 1.

Examples 1–8

The procedure of the Comparative Example was repeated except that the coating solution also contained the onium salt shown in Table 1. The minimum exposure energy to achieve maximum processed density (MEMD) is listed in Table 1. The stability of the 50% dot screens over the exposure range is shown in FIG. 1.

TABLE 1

| Example No. | Onium compound | wt % | MEMD[a] |
|---|---|---|---|
| 1 | tetraethylphosphonium bromide | 0.1 | 80 |
| 2 | diphenyl iodonium chloride | 0.1 | 95 |
| 3 | tetrabutyl ammonium bromide | 0.2 | 85 |
| 4 | trimethyl sulfonium iodide | 0.25 | 85 |
| 5 | tetraphenyl phosphonium iodide | 0.2 | 85 |
| 6 | trimethyl sulfoxonium iodide | 0.05 | 90 |
| 7 | tetraphenyl phosphonium bromide | 0.2 | 85 |
| 8 | tetramethyl ammonium bromide | 0.1 | 90 |

[a]Minimum exposure energy to achieve maximum processed density (mJ/cm$^2$)

Example 9

Preparation of MSHDS (2-Methoxy-4-(phenylamino)-benzenediazonium hexadecyl sulfate).

3.25 g of 2-methoxy-4-(phenylamino)-benzenediazonium bisulfate (Diversitec, Fort Collins, Colo.) in 50 ml of water was neutralized with 0.8 g of sodium bicarbonate in 25 ml water. 3.45 g of sodium hexadecyl sulfate (TCI America, Portland, Oreg., USA) was dissolved in 150 ml of water at 50° C. The solution of the diazonium salt as slowly added to the hexadecyl sulfate solution with stirring. The reaction mixture was stored in the dark at 0–5° C. for 12 hours. The resulting precipitate was filtered off and dried in vacuum. Yield: 5.4 g.

Proton NMR (in acetone-$d_6$): δ 0.87(3H, t), 1.31 (26H, m), 1.58 (2H, m), 3.90 (2H, t), 4.15 (3H, s), 6.90–7.60 (7H, m), 8.19 (1H, d), and 11.10 (1H, s).

Having described the invention, we now claim the following and their equivalents.

What is claimed is:

1. An imageable element comprising a layer of an imageable composition over a support;

in which the imageable composition comprises:

about 0.1 wt % to about 20% wt % of an infrared absorbing compound, about 1 wt % to about 50 wt % of an acid generator, about 5 wt % to about 70 wt % of an acid activatable crosslinking agent, about 20 wt % to about 85 wt % of a polymeric binder, and about 0.01 wt % to about 1 wt % of an added onium compound; and in which:

the added onium compound is different from the acid generator; and the added onium compound is a quaternary ammonium, odonium, sulphonium, phosphonium, oxysulphoxonium, oxysulphonium, sulphoxonium, ammonium, diazonium, selenonium, or arsonium compound.

2. The imageable element of claim 1 in which the added onium compound is an iodonium, sulphonium, or phosphonium compound.

3. The imageable element of claim 1 in which the added onium compound is a quaternary ammonium or sulphoxonium compound.

4. The imageable element of claim 1 in which the imageable composition comprises about 0.02 wt % to about 0.75 wt % of the added onium compound and about 1.5 wt % to about 25 wt % of the acid generator.

5. An imageable element comprising a layer of an imageable composition over a support;

in which the imageable composition comprises:

about 0.1 wt % to about 20% wt % of an infrared absorbing compound, about 1 wt % to about 50 wt % of an acid generator, about 5 wt % to about 70 wt % of an acid activatable crosslinking agent, about 20 wt % to about 85 wt % of a polymeric binder, and about 0.01 wt % to about 1 wt % of an added onium compound; and in which the anoin for the added onium compound is a chloride, bromide, or iodide.

6. The imageable element of claim 5 in which the imageable composition comprises about 0.02 wt % to about 0.75 wt % of the added onium compound and about 1.5 wt % to about 25 wt % of the acid generator.

7. The imageable element of claim 6 in which the added onium compound is a quaternary ammonium, phosphonium, iodonium, sulfonium or sulphoxonium compound.

8. The imageable element of claim 7 in which the imageable composition comprises about 0.025 wt % to about 0.5 wt % of the added onium compound.

9. The imageable element of claim 8 in which the acid generator is a diazonium organic sulfate.

10. The imageable element of claim 1 in which the imageable composition comprises about 0.025 wt % to about 0.5 wt % of the added onium compound.

11. The imageable element of claim 10 in which the added onium compound is a quaternary ammonium, phosphonium, iodonium, sulfonium or sulphoxonium compound.

12. The imageable element of claim 11 in which the added onium compound is a chloride, bromide, or iodide.

13. The imageable element of claim 12 in which the acid generator is a diazonium organic sulfate.

14. The imageable element of claim 13 in which the acid generator comprises 0.03 wt % to about 0.45 wt % of the added onium compound.

15. A method for forming an image, the method comprising the steps of:

(a) thermally imaging an imageable element comprising a layer of an imageable composition over a support, and forming an imaged imageable element comprising imaged and unimaged regions in the imageable layer;

in which the imageable composition comprises about 0.1 wt % to about 20% wt % of an infrared absorbing compound, about 1 wt % to about 50 wt % of an acid generator, about 5 wt % to about 70 wt % of an acid activatable crosslinking agent, about 20 wt % to about 85 wt % of a polymeric binder, and about 0.01 wt % to about 1 wt % of an added onium compound;

(b) removing the unimaged regions with a developer and forming the image; and in which:

the added onium compound is different from the acid generator; and the added onium compound is a quaternary ammonium, iodonium, sulphonium, phosphonium, oxysulphoxonium, oxysulphonium, sulphoxonium, ammonium, diazonium, selenonium, or arsonium compound.

16. The method of claim 15 additionally comprising, after step (a) and before step (b), the step of heating the imaged imageable element to about 110° C. to 150° C.

17. The method of claim 15 in which imaging is carried out with infrared radiation.

18. The method of claim 15 in which the imageable composition comprises about 0.02 wt % to about 0.75 wt % of the added onium compound and about 1.5 wt % to about 25 wt % of the acid generator.

19. The method of claim 18 in which the anoin for the added onium compound is a chloride, bromide, or iodide.

20. The method of claim 19 in which the added onium compound is a quaternary ammonium, phosphonium, iodonium, sulfonium or sulphoxonium compound.

21. The method of claim 20 in which imaging is carried out with infrared radiation.

22. The method of claim 21 in which the imageable composition comprises about 0.025 wt % to about 0.5 wt % of the added onium compound.

23. The method of claim 15 additionally comprising, after step (a) and before step (b), the step of heating the imaged imageable element to about 110° C. to 150° C., and in which imaging is carried out with infrared radiation;

the imageable composition comprises about 0.025 wt % to about 0.5 wt % of the added onium compound;

the added onium compound is a chloride, bromide, or iodide; and.

the added onium compound is a quaternary ammonium, phosphonium, iodonium, sulfonium or sulphoxonium compound.

24. The method of claim 23 in which the acid generator is a diazonium organic sulfate.

* * * * *